(12) United States Patent
Goetzke

(10) Patent No.: US 6,670,568 B2
(45) Date of Patent: Dec. 30, 2003

(54) INSTALLATION FOR PROCESSING WAFERS

(75) Inventor: Michael Goetzke, Immenstaad (DE)

(73) Assignee: Infineon Technologies AG, Munich (DE)

( * ) Notice: Subject to any disclaimer, the term of this patent is extended or adjusted under 35 U.S.C. 154(b) by 66 days.

(21) Appl. No.: 10/014,245

(22) Filed: Nov. 7, 2001

(65) Prior Publication Data
US 2002/0060172 A1 May 23, 2002

Related U.S. Application Data

(63) Continuation of application No. PCT/DE00/01450, filed on May 5, 2000.

(30) Foreign Application Priority Data

May 7, 1999 (DE) .......................................... 199 21 243

(51) Int. Cl.[7] .............................................. B07C 5/344
(52) U.S. Cl. ....................... 209/567; 414/222; 414/940; 198/346.2
(58) Field of Search ............................... 209/559, 563, 209/583, 586, 630, 933, 567; 414/225, 757, 222, 937, 940; 198/346.1, 346.2

(56) References Cited

U.S. PATENT DOCUMENTS

| 5,772,387 A | 6/1998 | Nakamura et al. .......... 414/416 |
| 5,972,727 A | 10/1999 | Ryan et al. ............. 250/548 X |
| 6,137,303 A | * 10/2000 | Deckert et al. ..... 414/226.01 X |
| 6,336,546 B1 | * 1/2002 | Lorenz .................. 414/940 X |
| 6,457,587 B1 | * 10/2002 | Conboy et al. ............. 209/630 |

FOREIGN PATENT DOCUMENTS

| DE | 37 35 449 A 1 | 5/1989 |
| DE | 195 23 969 A 1 | 1/1996 |
| DE | 195 14 037 A1 | 10/1996 |
| DE | 196 52 254 C 1 | 3/1998 |
| DE | 199 62 703 A 1 | 7/2000 |
| GB | 2 210 996 A | 6/1989 |
| GB | 2 249 868 A | 5/1992 |
| JP | 08268512 A | 10/1996 |
| WO | WO 00/22653 | 4/2000 |

* cited by examiner

Primary Examiner—Tuan N. Nguyen
(74) Attorney, Agent, or Firm—Laurence A. Greenberg; Werner H. Stemer; Ralph E. Locher

(57) ABSTRACT

An installation for processing wafers in at least one clean room is described. The installation has a configuration of production units for carrying out individual production steps and measuring units for inspecting the production steps. The production units and the measuring units are connected via a transport system for feeding and removing the wafers. At least one measuring unit together with an unloading station for delivering wafers to the transport system forms a measuring station, in which case wafers processed so as to be free of defects can be delivered from the measuring station separately from the remaining wafers.

12 Claims, 2 Drawing Sheets

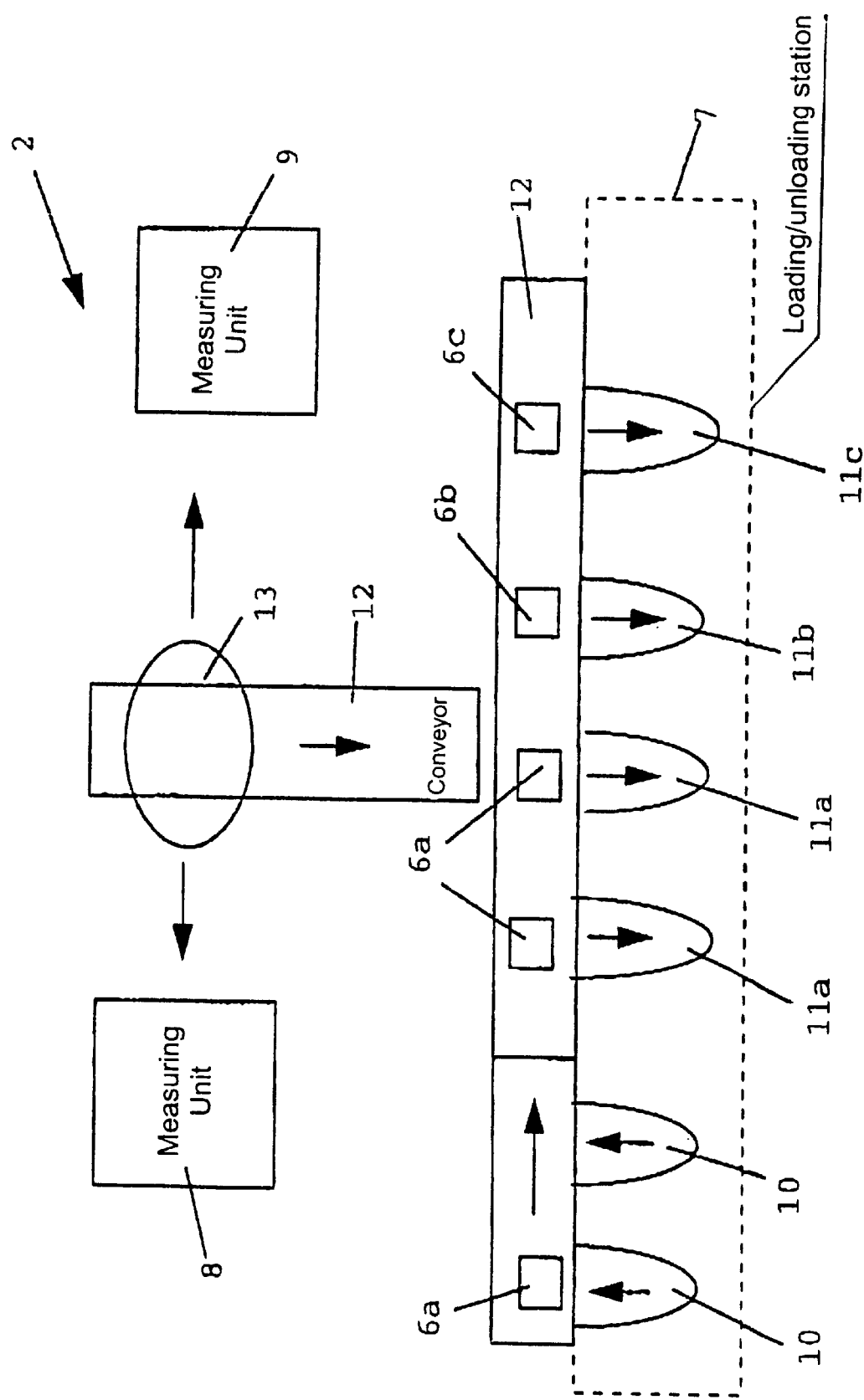

INSTALLATION FOR PROCESSING WAFERS

CROSS-REFERENCE TO RELATED APPLICATION

This application is a continuation of copending International Application No. PCT/DE00/01450, filed May 5, 2000, which designated the United States.

BACKGROUND OF THE INVENTION

Field of the Invention

The invention relates to an installation for processing wafers in at least one clean room. The installation has a configuration of production units for carrying our individual production steps on the wafers. The production units and measuring units are connected via a transport system for feeding and removing the wafers.

Such installations contain a multiplicity of production units with which different production steps for processing the wafers are carried out. The production steps involve, in particular, etching processes, wet chemical processes, diffusion processes and diverse cleaning processes, such as, for example, chemical mechanical polishing (CMP) processes. For each of the corresponding production steps, one or more production units are provided. In addition, measuring units in which the quality of the processing of the wafers can be inspected are provided. All the production steps that are carried out in the production units are expediently inspected with such measuring units.

The entire production process is subject to strict purity requirements, so that the production units and measuring units are disposed in a clean room or in a system of clean rooms.

The wafers are fed in predetermined batch sizes to the individual production and measuring units via a transport system. To this end, the wafers are transported in transport containers, which are configured in the form of cassettes for example, the transport containers each receiving the same number of wafers. The removal after the processing of the wafers in the production and measuring units is also effected via the transport system, the wafers being stored in the same transport containers in the process.

The transport system has a conveyor system that is configured, for example, in the form of roller conveyors. In addition, the transport system has a storage system having a plurality of storage devices for storing transport containers containing the wafers. The storage devices are expediently configured as stockers. Such stockers are storage systems in which wafers are stored under clean-room conditions.

In known installations for processing wafers, a batch of wafers which is collected in a transport container is directed via the transport system through all the production and measuring units of the installation. In the process, the batch maintains its association with the respective transport container. Therefore, the wafers of different batches are not intermixed.

In this case, for processing the wafers, a respective transport container containing a batch is fed to a production unit via a loading and unloading station. After the processing of the wafers in the production unit, the batch is delivered again to the transport system in the same transport container via the loading and unloading station.

To inspect the production step carried out in the production unit, the transport container is then fed to a corresponding measuring unit, which likewise has a loading and unloading station.

In the measuring unit, it is checked whether the individual wafers of the batch have been correctly processed. In the process, the wafers are normally classified according to defect-free wafers, rejected wafers, which have defects which cannot be removed, and wafers to be reworked, which will meet the required quality again by reworking.

The rejected wafers, which can no longer be used, are separated from the production process, whereas the transport container is filled again with the wafers to be reworked and with the defect-free wafers, and these wafers are delivered via the unloading station. Since some wafers of the batch are sorted out as rejects, gaps remain in the transport container.

A disadvantage in this case is that, in such installations, transport containers only partly filled with wafers are in circulation. This not only results in insufficient utilization of the transport capacities. On the contrary, this also involves a long transit time of the wafers through the installation. In this case, it is especially disadvantageous that, during subsequent production processes in which a plurality of batches are combined, no optimum utilization is achieved. This includes, in particular, oxidation processes that are carried out in furnaces. During the processes, in order to avoid gaps in a transport batch, the gaps are filled with "dummy" wafers until the number of wafers corresponds to the original batch size. Such dummy wafers, apart from the wildcard function in the transport batch, the wildcard function ensuring a homogeneous temperature distribution inside the furnace, have no further function and are of no use in particular for the further production process in the installation.

This makes it necessary to temporarily store such transport containers in separate storage systems in order to feed them at a suitable later moment to production units in which the reworking of the wafers to be reworked can be effected. The defect-free wafers likewise disposed in the transport container are carried along in the batch in the transport container at the same time. This results in considerable waiting times for the defect-free wafers.

Published, Non-Prosecuted German Patent Application DE 37 35 449 A1 discloses a production system for wafers that is composed of a plurality of interchangeable transport modules, process modules and inspection modules. Each process module has in each case at least one process station, one storage place and one manipulating device.

The wafers are supplied in a first cassette via the transport module. The manipulating device removes the wafers from the first cassette and feeds them to the process stations and storage places. Useless wafers are detected in the inspection module and are collected, if need be, in a second cassette. The second cassette may serve to temporarily store the useless wafers. Alternatively, the useless wafers are discharged from the inspection module. The defect-free wafers are collected in cassettes and are delivered again to the transport module.

Published, Non-Prosecuted German Patent Application DE 195 14 037 A1 relates to a transport device for conveying substrates. The transport device is configured as a rotary table that is driven at a uniform clock frequency. The substrate can be fed by a rotatably mounted substrate gripper to a process station provided outside the rotary table.

Published, Non-Prosecuted German Patent Application DE 195 23 969 A1 discloses an IC transport system that can be operated in conjunction with a tray-like magazine or a bar-shaped magazine. By a method for the repeated testing of modules in an IC inspection handling apparatus, modules stored in the magazine are repeatedly tested without intervention by an operator and the modules are sorted according to the test results and stored in the magazine.

Published, Japanese Patent Application JP 08268512 A relates to a storage unit for storing substrates. The storage unit contains a sorting unit, by which the substrates are automatically sorted and are put into or taken out of storage in cassettes in the storage unit.

SUMMARY OF THE INVENTION

It is accordingly an object of the invention to provide an installation for processing wafers that overcomes the above-mentioned disadvantages of the prior art devices of this general type, in which a material flow of the wafers through the installation is as efficient as possible.

With the foregoing and other objects in view there is provided, in accordance with the invention, an installation for processing wafers in at least one clean room. The installation includes a multiplicity of production units for carrying out individual production steps on the wafers, a measuring station having at least one measuring unit for inspecting the wafers and an unloading station, and a transport system connecting the production units to the measuring station. The transport system feeds and removes the wafers to and from the production units and the measuring units. The unloading station delivering the wafers to the transport system. Transport containers are provided and are transported on the transport system. The transport containers include first transport containers to be filled with defect free wafers from the measuring station, second transport containers to be filled with the wafers to be reworked, and third transport containers to be filled with rejected wafers. The first, second and third transport containers are marked differently. The first, second and third transport containers are loaded from the measuring station separately from one another via the unloading station, and the second transport containers filled with the wafers to be reworked are delivered to the production units for carrying out reworking processes.

According to the invention, the measuring stations are provided in the installation for processing the wafers, the measuring stations each having one or more measuring units and at least one unloading station for delivering the wafers to the transport system.

In the measuring station, first transport containers are filled with defect-free wafers that have successfully passed the inspection in the measuring unit or measuring units of the measuring station. Second transport containers are filled with the remaining wafers, which are not free of defects. In this case, the second transport containers are expediently filled with wafers to be reworked. Finally, third transport containers are filled with rejected wafers, which can no longer be reworked.

Via the unloading station of the measuring station, the different transport containers are delivered to the transport system separately from one another. In this case, the first, second and, if need be, third transport containers are marked differently, preferably in different colors and are delivered via various unloading ports of the unloading station, which are preferably marked in a corresponding manner.

The essential advantage of the installation according to the invention consists in the fact that first transport containers that are completely filled with defect-free wafers are delivered via the measuring station. Only these wafers remain in the production process in the installation, so that an optimum degree of utilization of the transport containers is achieved, which also leads to a considerable reduction in the transit time of the wafers through the installation. The rejected wafers can be discharged completely from the production process at the outlet of the measuring station. The second transport containers filled with wafers to be reworked, if need be after being stored temporarily, are fed to production units for carrying out the reworking processes. It is especially advantageous in this case that the second transport containers no longer contain any defect-free wafers, so that no unnecessary waiting times arise for the defect-free wafers. The reworking processes themselves also become more efficient as a result, since only the second transport containers in which wafers which are only to be reworked are located are fed to the corresponding production units. Corresponding sorting operations are therefore dispensed with. Finally, it is advantageous that the different markings of the first, second and third transport containers makes it possible to assign the different transport containers to the respective production and measuring units without any errors and in a simple manner.

In accordance with an added feature of the invention, the unloading station has separate unloading ports and the first, second and third transport containers can be loaded via the separate unloading ports.

In accordance with an additional feature of the invention, the first, second and third transport containers are marked with different colors. The first transport containers are marked with a green color, the second transport containers are marked with a yellow color, and the third transport containers are marked with a red color. The unloading ports are marked with the different colors of the transport containers assigned to the unloading ports.

In accordance with another feature of the invention, a storage system is provided for temporarily storing at least one of the second transport containers and the third transport containers. The storage system has storage devices and the second and third transport containers are temporarily stored in separate ones of the storage devices.

In accordance with a further feature of the invention, at least one of the wafers to be reworked in the second transport containers and the rejected wafers in the third transport containers are removed from storage manually at the unloading ports of the unloading stations.

In accordance with another added feature of the invention, the wafers have markings for identifying them.

In accordance with a further additional feature of the invention, the wafers supplied in predetermined batch sizes to the measuring station are singularized in the measuring station.

In accordance with a concomitant feature of the invention, the wafers are processed individually in the measuring station, and the at least one measuring unit is one of a plurality of measuring units. Additionally, the measuring station is one of a plurality of measuring stations.

Other features which are considered as characteristic for the invention are set forth in the appended claims.

Although the invention is illustrated and described herein as embodied in an installation for processing wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic representation of a measuring station shown in FIG. 1.

DESCRIPTION OF THE PREFERRED EMBODIMENTS

Figure 1:
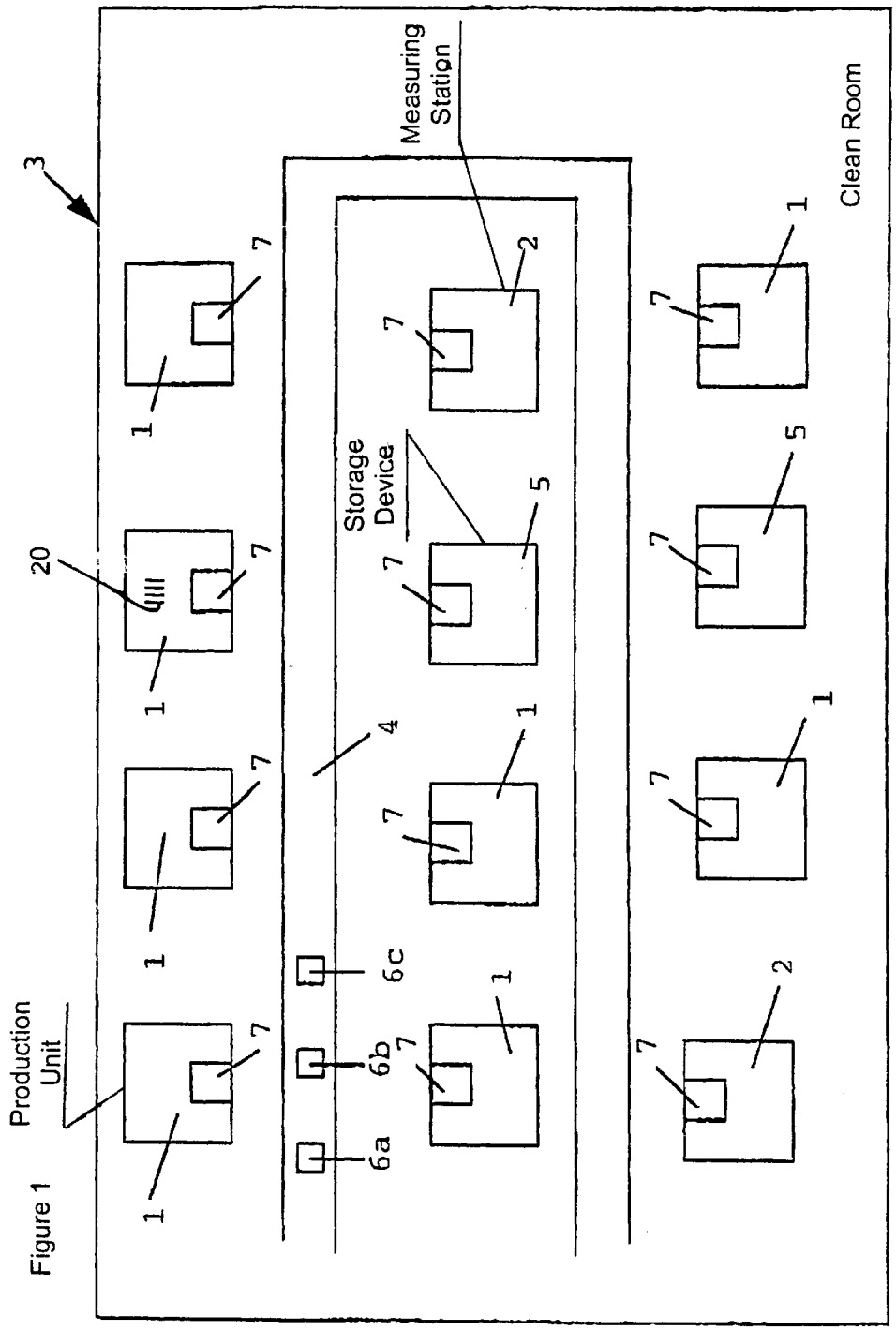
FIG. 1 is a schematic representation of an installation for processing wafers, having a plurality of production units and measuring stations according to the invention.

Referring now to the figures of the drawing in detail and first, particularly, to FIG. 1 thereof, there is shown an exemplary embodiment of an installation for processing wafers 20. The installation contains a multiplicity of production units 1 for carrying out production steps necessary for the processing of the wafers 20. Such production steps contain processing operations for performing etching processes, wet chemical processes, diffusion processes and cleaning processes. In each case one or more production units 1 may be provided for the production steps.

In addition, the installation contains a multiplicity of measuring stations 2, in which the results of the individual production steps are checked.

The production units 1 and the measuring stations 2 are disposed in a clean room 3. Alternatively, the installation may be distributed over a system of clean rooms 3.

The production units 1 and the measuring stations 2 are connected to one another via a transport system. The transport system has a conveyor system 4 and a storage system. The conveyor system 4 may be formed, for example, by a system of roller conveyors 12. Storage devices 5 of the storage system are preferably configured as stockers 5.

The wafers 20 are transported via the conveyor system 4 in transport containers 6a, 6b, 6c. The transport containers 6a, 6b, 6c may be configured in the form of cassettes or the like. For the feeding and the removal, the production units 1, the measuring stations 2 and the storage devices 5 in each case have at least one loading and unloading station 7.

The wafers 20 in certain batch sizes in a respective transport container 6a are expediently fed to the individual production units 1. After the processing of the wafers 20 in the production unit 1, the wafers 20 are delivered in the same transport container 6a to the transport system and are fed via the latter to a measuring station 2 for checking the quality of the processing in the production unit 1.

The construction of the measuring station 2 is shown by way of example in FIG. 2. The measuring station 2 has two measuring units 8, 9, in which different inspection functions can be realized. For example, the measuring station 2 may be provided for inspecting production steps of a lithographic process carried out in a plurality of production units 1. One measuring unit 8 may then typically be configured as an inspection system which checks whether multiple structures that have wafers in the interior are disposed so as to lie correctly one above the other. The second measuring unit 9 may be configured as an optical inspection device for detecting warping on the wafers 20.

The measuring station 2 has the loading and unloading station 7, via which the transport containers 6a, 6b, 6c containing the wafers 20 are supplied and delivered from the measuring station 2 to the transport system 4. The loading and unloading station 7 are formed of a loading station and an unloading station that are disposed spatially separate from one another. In the present exemplary embodiment, two loading ports 10 are provided as the loading station. The unloading station has a plurality of unloading ports 11a, 11b, 11c. The roller conveyors 12 lead from the loading ports 10 and the unloading ports 11a, 11b, 11c to the measuring units 8, 9. At the roller conveyors 12, a manipulating device 13, which may be formed by a robot or the like, is disposed in the region of the measuring units 8, 9. The wafers 20 are expediently singularized directly after entering the measuring station 2. This may be effected by the operating personnel or by non-illustrated grippers. In this case, the individual wafers 20 are removed from the transport containers 6a and fed via the roller conveyors 12 to the measuring units 8, 9. Via the manipulating device 13, the wafers 20 are fed individually to the measuring units 8, 9 and are removed individually from the measuring units 8, 9. Therefore, the wafers 20 are processed individually in the entire measuring station 2 separately from the batch sizes predetermined by the capacities of the transport containers 6a, 6b, 6c.

So that the identification of the individual wafers 20 is ensured, a marking is provided on each wafer 20, and the marking can be read by non-illustrated detecting systems. For example, bar codes may be attached to the wafers 20 at locations that are separated as waste from the useful area of the wafers 20 at the end of the production process; the detecting systems are then formed by bar code readers.

According to the invention, different transport containers 6a, 6b, 6c are filled with the individual wafers 20 in accordance with the respective processing quality after the inspection in the measuring units 8, 9. The filling may be effected by the manipulating device 13. Alternatively, the filling may be effected by the operating personnel or by the grippers at the outlet of the measuring station 2. First transport containers 6a are filled with defect-free wafers 20 that have successfully passed the inspection in the measuring units 8, 9. Second transport containers 6b are filled with the wafers 20 to be reworked which have slight defects that can be removed by suitable reworking processes. Finally, third transport containers 6c are filled with rejected wafers, which have serious defects that can no longer be removed.

The measuring station 2 according to FIG. 2 involves the measuring units 8, 9 for inspecting lithographic processes. In these processes, the wafers 20 to be reworked normally accumulate. In other production processes, such as oxidation processes for example, normally only defect-free wafers or rejected wafers accumulate, since, in the case of defective processing, the defects on the wafers 20 are so serious that rework is no longer possible. In this case, only two sorts of transport containers 6a, 6c are required in the measuring station 2.

In the exemplary embodiment according to FIG. 2, the first, second and third transport containers 6a, 6b, 6c are delivered separately from the measuring station 2 via the different unloading ports 11a, 11b, 11c.

In order to avoid mix-ups, the first, second and third transport containers 6a, 6b, 6c are marked differently. The first transport containers 6a containing the defect-free wafers are marked with a green color. The second transport containers 6b containing the wafers to be reworked are marked with a yellow color. Finally, the third transport containers 6c containing the rejected wafers are marked with a red color.

The unloading ports 11a, 11b, 11c, via which the different transport containers 6a, 6b, 6c are delivered, are marked in the corresponding colors. In the present exemplary embodiment, two unloading ports 11a marked with a green color are provided for delivering the first transport containers 6a marked in green. In addition, respective unloading ports 11b, 11c marked in yellow and red are provided for delivering the transport containers 6b, 6c marked in yellow and red.

The transport containers 6a marked in green are completely filled with defect-free wafers and, after delivery from the measuring station 2, are fed to the further production units 1 and measuring stations 2 for processing.

Thus only defect-free wafers in the transport containers 6a marked with a green color are in circulation in the installation for processing.

In a further advantageous embodiment of the invention, not all the wafers 20 are checked in the measuring station 2. On the contrary, only a predetermined portion of the wafers 20 are checked. In this case, only some of the wafers 20 in the green transport containers are checked for freedom from defects.

The rejected wafers in the transport containers 6c marked in red are expediently sorted out immediately at the outlet of the respective measuring station 2. This process may be advantageously carried out manually.

The wafers 20 to be reworked in the transport containers 6b marked in yellow are expediently stored temporarily in the storage devices 5 in order to then be fed at suitable moments to the production units 1 for reworking.

These processes for removing from storage and for feeding may in particular be carried out manually, as a result of which the wafers 20 to be reworked are separate from the circulation of the defect-free wafers on the conveyor system 4.

I claim:

1. An installation for processing wafers in at least one clean room, comprising:

a multiplicity of production units for carrying out individual production steps on the wafers;

a measuring station having at least one measuring unit for inspecting the wafers and an unloading station;

a transport system connecting said production units to said measuring station, said transport system feeding and removing the wafers to and from said production units and said measuring units, said unloading station delivering the wafers to said transport system; and transport containers transportable on said transport system including first transport containers for filling with defect free wafers from said measuring station, second transport containers for filling with the wafers to be reworked, and third transport containers for filling with rejected wafers, said first, second and third transport containers being marked differently, said first, second and third transport containers able to be loaded from said measuring station separately from one another via said unloading station, and said second transport containers filled with the wafers to be reworked can be fed to said production units for carrying out reworking processes.

2. The installation according to claim 1, wherein said unloading station has separate unloading ports and said first, second and third transport containers can be loaded via said separate unloading ports.

3. The installation according to claim 2, wherein said first, second and third transport containers are marked with different colors.

4. The installation according to claim 3, wherein said first transport containers are marked with a green color, said second transport containers are marked with a yellow color, and said third transport containers are marked with a red color.

5. The installation according to claim 3, wherein said unloading ports are marked with said different colors of said transport containers assigned to said unloading ports.

6. The installation according to claim 1, including a storage system for temporarily storing at least one of said second transport containers and said third transport containers.

7. The installation according to claim 6, wherein said storage system has storage devices and said second and third transport containers are temporarily stored in separate ones of said storage devices.

8. The installation according to claim 6, wherein at least one of the wafers to be reworked in said second transport containers and the rejected wafers in said third transport containers are removed from storage manually at said unloading ports of said unloading stations.

9. The installation according to claim 1, wherein the wafers have markings for identifying them.

10. The installation according to claim 9, wherein the wafers supplied in predetermined batch sizes to said measuring station are singularized in said measuring station.

11. The installation according to claim 10, wherein the wafers are processed individually in said measuring station, and said at least one measuring unit is one of a plurality of measuring units.

12. The installation according to claim 1, wherein said measuring station is one of a plurality of measuring stations.

* * * * *